(12) United States Patent
El-Ghoroury et al.

(10) Patent No.: US 7,295,645 B1
(45) Date of Patent: Nov. 13, 2007

(54) SYSTEM, METHOD AND APPARATUS TO IMPLEMENT LOW POWER HIGH PERFORMANCE TRANSCEIVERS WITH SCALABLE ANALOG TO DIGITAL CONVERSION RESOLUTION AND DYNAMIC RANGE

(75) Inventors: Hussein S. El-Ghoroury, Carlsbad, CA (US); Murat F. Karsi, Encinitas, CA (US)

(73) Assignee: Ellipsis Digital Systems, Inc., Carlsbad, CA (US)

( * ) Notice: Subject to any disclaimer, the term of this patent is extended or adjusted under 35 U.S.C. 154(b) by 738 days.

(21) Appl. No.: 10/353,336

(22) Filed: Jan. 29, 2003

Related U.S. Application Data

(60) Provisional application No. 60/352,724, filed on Jan. 29, 2002.

(51) Int. Cl.
*H04L 27/08* (2006.01)
(52) U.S. Cl. .................................................... 375/395
(58) Field of Classification Search ................ 375/243, 375/244, 245, 345, 358; 341/126, 138, 142, 341/155, 172; 455/69, 70
See application file for complete search history.

(56) References Cited

U.S. PATENT DOCUMENTS

| | | | |
|---|---|---|---|
| 5,187,482 A * | 2/1993 | Tiemann et al. | 341/143 |
| 5,389,927 A * | 2/1995 | Turney et al. | 341/139 |
| 6,255,974 B1 * | 7/2001 | Morizio et al. | 341/143 |
| 6,456,219 B1 * | 9/2002 | Schreiber et al. | 341/155 |
| 6,498,819 B1 * | 12/2002 | Martin | 375/345 |
| 6,686,860 B2 * | 2/2004 | Gulati et al. | 341/155 |
| 6,842,478 B1 * | 1/2005 | Ogino | 375/147 |
| 2003/0011499 A1 * | 1/2003 | Amar et al. | 341/155 |
| 2003/0067404 A1 * | 4/2003 | Ruha et al. | 341/143 |
| 2003/0078007 A1 * | 4/2003 | Parssinen et al. | 455/67.1 |

OTHER PUBLICATIONS

Dick et al. FPGA Signal Processing Using Sigma-Delta Modulation, IEEE Signal Processing Magazine, Jan. 2000, p. 20-35.*

* cited by examiner

*Primary Examiner*—Khanh C. Tran
*Assistant Examiner*—Sam K. Ahn
(74) *Attorney, Agent, or Firm*—Blakely, Sokoloff, Taylor & Zafman LLP

(57) ABSTRACT

The present invention provides for operation of a digital communication receiver having multiple operational modes so that power consumption of the system can be kept at a minimum by using the lowest power operation for the system components performing tasks associated with each of the respective one of the multiple operational modes. An example is the receiver A/D converter operation with the lowest power to provide the desired resolution. Also, the invention provides novel architectures for implementing scalable resolution A/D converters. Furthermore, the invention generally includes a novel architecture for controlling the dynamic range of an A/D converter. In addition, the invention generally involves novel architectures for controlling the dynamic range of an A/D converter to alleviate difficulties associated with AGC control loops. Multiple exemplary embodiments are disclosed.

9 Claims, 3 Drawing Sheets

Digital Receiver Architecture Using Scalable Analog to Digital Conversion Resolution & Dynamic Range - $V_{REF}$ Resistor Ladder Architecture

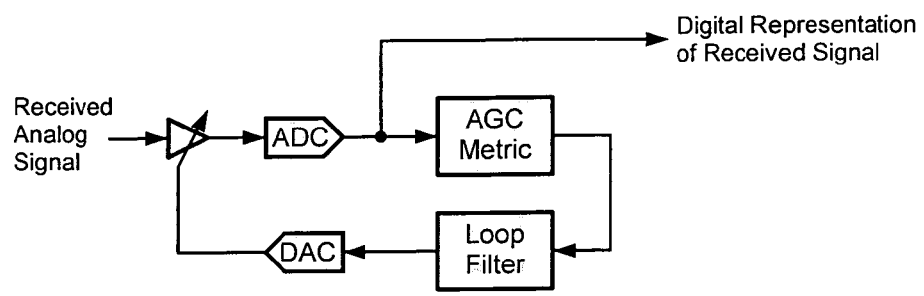
Figure 1: Conventional AGC Loop Design in Digital Receivers.
(Prior Art)
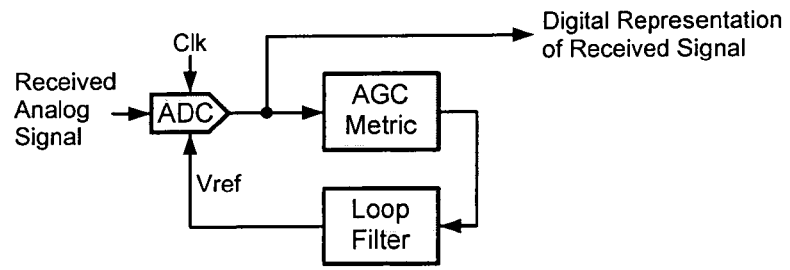
Figure 2: High Level Block Diagram of a Digital Receiver
Incorporating Variable Dynamic Range ADC

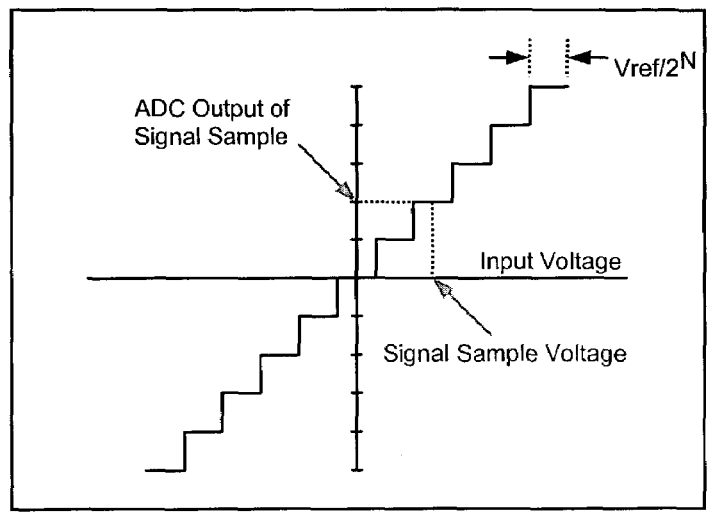
Figure 3: Principal Operation of a Conventional Uniform Quantization Analog to Digital Conversion
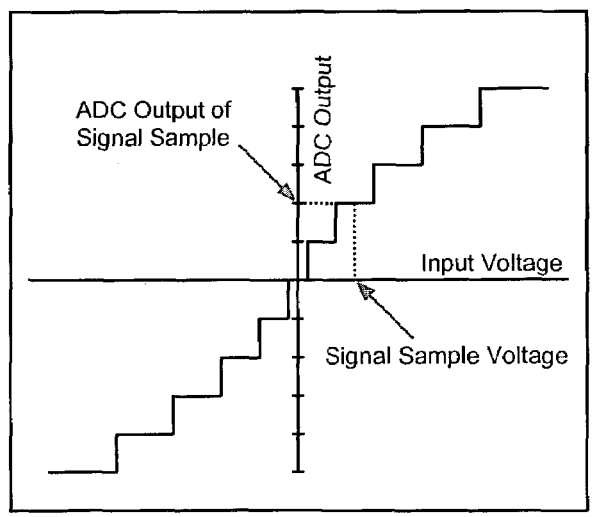
Figure 5: Principal Operation of a Non-Uniform Quantization Analog to Digital Conversion

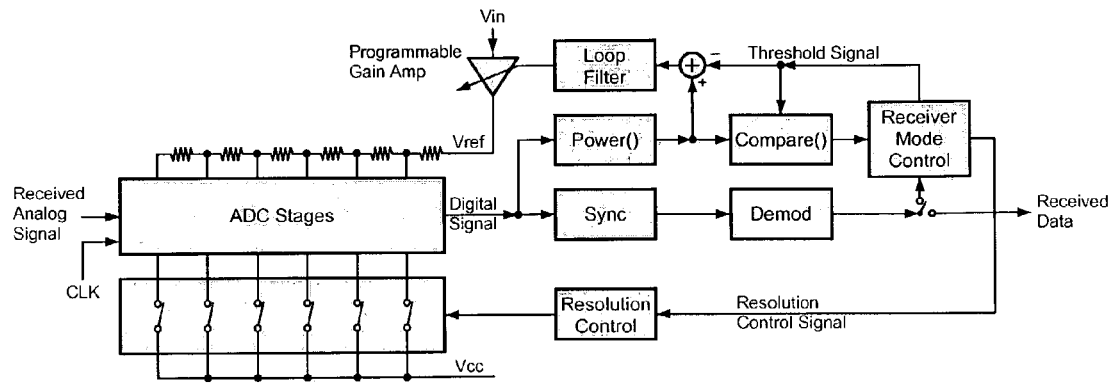
Figure 4-a: Digital Receiver Architecture Using Scalable
Analog to Digital Conversion Resolution & Dynamic Range - $V_{REF}$
Resistor Ladder Architecture
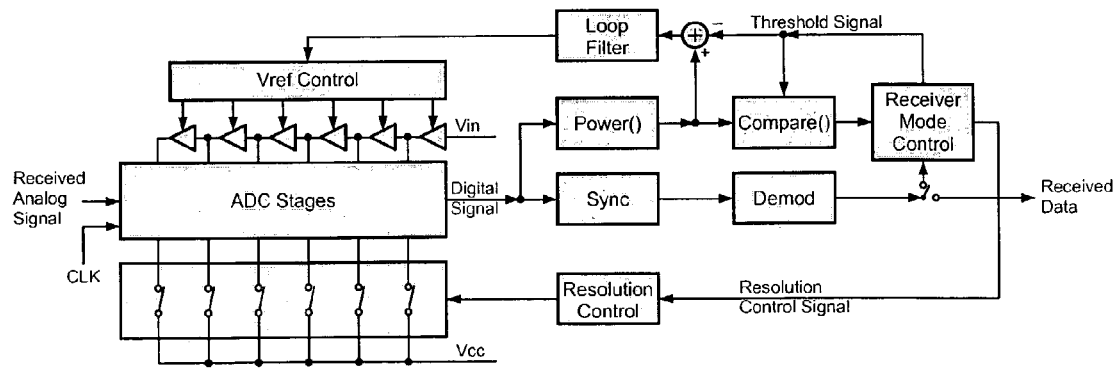
Figure 4-b: Digital Receiver Architecture Using Scalable
Analog to Digital Conversion Resolution & Dynamic Range - $V_{REF}$
Amplifier Ladder Architecture

SYSTEM, METHOD AND APPARATUS TO IMPLEMENT LOW POWER HIGH PERFORMANCE TRANSCEIVERS WITH SCALABLE ANALOG TO DIGITAL CONVERSION RESOLUTION AND DYNAMIC RANGE

CROSS-REFERENCE TO RELATED APPLICATION

This application claims the benefit of U.S. Provisional Patent Application No. 60/352,724 filed Jan. 29, 2002.

BACKGROUND OF THE INVENTION

1. Field of the Invention

The present invention relates to a system, method, and apparatus to implement low power high performance transceivers with scalable analog to digital conversion resolution and dynamic range.

2. General Background

A typical communications receiver operates in multiple modes wherein several different criteria of performance are suitable for each of the modes. For example, in a wireless LAN transceiver, it is desirable to have as little power consumption as possible during the time intervals that the receiver is scanning for a signal of interest (a.k.a. scanning mode, hereafter the search mode). The reason for this is that the transceiver can stay in the search mode for extensive time intervals. On the other hand, during the reception of a signal of interest (a.k.a. reception mode), a major criterion of performance is the capability of the receiver to process signals with high precision and sensitivity. The multiple operational modes, when viewed from the perspective of precision of A/D conversion, can be seen as contradictory.

Previously, receiver design involved a tradeoff between power consumption in the idle mode and the signal precision when receiving a signal of interest. However, this leads to a solution that is a compromise between the two conflicting performance requirements. As a result, sub-optimum performance is obtained in each of the operating scenarios. Furthermore, typical techniques of ADC dynamic range control have used high supply voltages and have depended on increases in the quality of the silicon process to improve the sensitivity of an A/D converter.

In conventional receiver front-end design, as shown in FIG. 1, a variable gain amplifier can precede the ADC. The Signal Power at the output of the ADC is measured and used to generate a control signal that is used to adjust the gain of the amplifier. The purpose of the loop shown in FIG. 1 is to insure efficient utilization of the ADC dynamic range.

Several problems can be attributed to the AGC Loop of FIG. 1. First, it requires a multiple bit Digital-to Analog converter (DAC) in the feedback path to control the variable amplifier gain. That normally contributes substantially to the cost of the receiver. Second, the variable gain amplifier usually exhibits gain response non-linearities that must be compensated for in the feedback path using look-up table (LUT) technique. Such techniques require a prior measurement of the variable gain amplifier non-linearities in order to generate the LUT. Furthermore, the characteristics of the amplifier will very likely change with temperature and with aging. Third, typically, the AGC amplifier is included in the design of receiver analog front-end, while the ADC, DAC and loop filters are implemented in the receiver digital back-end. This causes complexity in defining the interface between the two sections of the receiver typically done by two design teams.

BRIEF SUMMARY OF THE INVENTION

The present invention provides for operation of a digital communication receiver having multiple operational modes so that power consumption of the system can be kept at a minimum by using the lowest power operation for the system components performing tasks associated with each of the respective one of the multiple operational modes. An example is the receiver A/D converter operation with the lowest power to provide the desired resolution. Also, the invention provides novel architectures for implementing scalable resolution A/D converters. Furthermore, the invention generally includes a novel architecture for controlling the dynamic range of an A/D converter. In addition, the invention generally involves novel architectures for controlling the dynamic range of an A/D converter to alleviate difficulties associated with AGC control loops. Multiple exemplary embodiments are disclosed.

BRIEF DESCRIPTION OF THE DRAWINGS

FIG. 1 is a diagram illustrating a prior art AGC loop.

FIG. 2 presents a high level block diagram of a digital receiver incorporating a variable dynamic range ADC.

FIG. 3 illustrates the conversion by an ADC of analog signal samples to multiple quantization levels separated by Vref.

FIG. 4-*a* is a block diagram of an exemplary digital receiver architecture using scalable analog to digital conversion resolution and dynamic range using a $V_{REF}$ resistor ladder architecture.

FIG. 4-*b* is a block diagram of an exemplary digital receiver architecture using scalable analog to digital conversion resolution and dynamic range using a $V_{REF}$ amplifier ladder architecture.

FIG. 5 illustrates the conversion by an ADC of analog signal samples to multiple quantization levels using Adaptive Non-Uniform Quantization.

DETAILED DESCRIPTION OF THE PREFERRED EMBODIMENTS

The present invention relates to a system, method, and apparatus to implement low power high performance transceivers with scalable analog to digital conversion resolution and dynamic range. As used herein, "Scalable Resolution" means is the ability to change the number of bits that are associated with the data conversion from analog to digital. "Scalable Dynamic Range" means the ability to change the dynamic range of the analog to digital conversion process in terms of the full voltage swing of the input analog signal. Also, as used herein, the words "mode" and "state" have the same meaning, and may be used interchangeably.

In this invention, a method of operating in a low power mode when the receiver is in the search mode, and operating in a high precision mode when the receiver is in the reception mode is disclosed. The proposed method can be implemented by running an A/D converter in the low power mode in the search mode, and by running the A/D converter in the high precision mode when the receiver is in the reception mode.

In the search mode, the A/D converter can be typically operated with a resolution that provides a small number of resolution bits. In the reception mode, the A/D converter can be typically operated in a high precision mode. The power consumption of A/D converters usually increases when the number of resolution bits increases. Thus in the search mode, the A/D converter could be operated with as low as 1 bit precision, and would therefore consume little power. In the reception mode, the A/D converter would provide high precision.

The disclosed method can alternatively be implemented by generally utilizing a scaling of the resolution of the number of bits provided by an A/D converter. Thus, the A/D converter is operated in a low power mode in the search mode. In the reception mode, the A/D converter is switched to high-resolution mode. This may for example done by turning off several sub-blocks of the A/D converter in the search mode and operating a larger proportion or all of the sub-blocks of the A/D converter in the reception mode.

In this invention, a method to control the dynamic range of an A/D converter is also disclosed. The dynamic range of an A/D converter can be controlled by implementing the A/D converter in a parallel or series form of multiple A/D converter sub-blocks, wherein each sub-block has a reference voltage (Vref) that controls the dynamic range of the sub-block. It is then possible to control the overall dynamic range of the overall A/D converter by controlling each of reference voltages of the sub blocks. In one embodiment, a single control voltage can be used to set the different reference voltages of the sub-blocks. In an alternative embodiment, each of the individual reference voltages can be controlled to obtain a desired amplitude transfer function (for example, compression or expansion).

Additionally disclosed is a novel architecture for controlling the dynamic range of an A/D converter to alleviate difficulties associated with AGC control loops. Automatic gain control circuits typically utilize feedback loops that are cumbersome to implement. It is possible to control the dynamic range of the signal at the A/D converter input by varying the reference voltage of the A/D converter. As a result, requirements on the AGC control circuitry can be simplified and reduced.

The novel architecture is a new way to ensure that a received analog signal fits within the dynamic range of an ADC. If the mechanism to ensure efficient utilization of ADC dynamic range is done exclusively in the receiver digital back-end, some benefits can be realized. One benefit could include avoiding the problems previously mentioned, as well as several others that will be highlighted once the details of this invention are described.

A high level block diagram of a variable range ADC is shown in FIG. 2. One aspect of the invention will become clear by explaining the underlying principle of ADC operation. In principle, the ADC creates a digital representation of the received analog signal by comparing the amplitude (in volts) of the analog signal samples to multiple quantization levels separated by Vref, the voltage reference defining the quantization step of the ADC. This concept of operation is illustrated in FIG. 3.

Because the ADC has a finite word length representing the number of output bits, the input dynamic range that can be handled by the ADC is limited to a finite number. The dynamic range limitation can cause two types of problems. When the input signal is weak, it may fall below the resolution of the ADC or be severely corrupted with quantization noise. On the other hand, when the input signal is too strong, it may exceed the highest quantization level of the ADC and be severely distorted due to clipping.

The aforementioned problems or drawbacks resulting from conventional designs can be dealt with in conventional designs by incorporating the traditional AGC Loop shown in FIG. 1. The drawbacks of conventional AGC Loop design were also previously highlighted. Most of the drawbacks can be overcome by adopting the Dynamic Range Control technique of this invention. The reference voltage Vref of the ADC can be dynamically varied rather than varying the input signal level.

It should be noted that the aforementioned novel methods and architectures could be applied to any digital communication receiver designed to be operable in multiple modes of low power consumption and high resolution through managing A/D converter power consumption and resolution. It should also be noted that the aforementioned novel methods and architectures could be applied to any processing block of a digital communications receiver where the block is designed to operate in a low precision, low power operation mode, particularly for an extensive time interval, and to switch to a high precision, high power consumption mode when necessary.

The present invention is not only applicable to the design of digital communication systems in general, but to WLAN Receiver architectures in particular. In communication products where the power consumption is important, such as mobile devices, the present invention recognizes that the number of bits needed to sufficiently represent the received analog signal differs depending on whether the Receiver is searching for the signal (Search state), trying to acquire the signal (Sync state), or is demodulating the signal (Receive Control and Data states). The invention also recognizes that in protocols whereby the physical layer uses a multiplicity of modulation waveforms, such as the WLAN 802.11 standard, which uses BPSK, QPSK, 16-QAM and 64-QAM modulations, the overall power consumption of the Analog-to-Digital Converter (ADC) can be greatly reduced if one is able to adjust the ADC Resolution (in terms of number of bits used to represent the received analog signal) depending on the operational state of the Receiver. By changing the number of bits of the ADC depending on the state of the Receiver, the power consumption of the ADC as well as the overall system can be substantially reduced.

This concept is shown in greater detail in FIG. 4-a. In this Figure, the ADC is shown in the front-end of the Digital Receiver subsystem having an analog signal input (Received analog signal), which is usually supplied by the Radio subsystem, and outputs a digital representation of that signal (Received data) to the remainder of the Digital Receiver blocks. In FIG. 4-a, the core stages of the ADC (ADC stages) are provided with a reference voltage ($V_{REF}$) and supply voltage ($V_{CC}$). The reference Voltage ($V_{REF}$) is controlled by the Dynamic Range Control Loop, which consists of:

(a) Power( ) block which calculates the power of the digital signal output of the ADC. "Power" as used herein means the square of the amplitude of the digital signal, or some other response to the digital signal that is generally indicative of power. By way of example, the received analog signal is provided to the digital receiver as two components; namely, In-Phase (a.k.a. I-component) and Quadrature (a.k.a. Q-component). In such cases, the ADC Core actually consists of two ADCs operating in parallel, one for digitizing the I-component and the second for digitizing the Q-component. The "Power" of such digital signal may be calculated as ($I^2+Q^2$);

(b) Loop Filter block which smoothes (Filters) the output of the Power( ) block to prevent the loop from responding to signal power fluctuations caused by the presence of additive noise within the received signal;

(c) Programmable Gain Amplifier (PGA) block which changes its Gain (where the Gain is defined as the Ratio $V_{REF}/V_{IN}$) based on the value of the $V_{REF}$ Control Signal provided by the output of the Loop Filter (it should be noted that the PGA block can be implemented using a DAC that will convert the digital output signal of the Loop Filter into an analog signal that can be used to control the gain of a Variable Gain Amplifier, or alternatively, it could also be implemented as a cascade of fixed gain stages whose on/off state can be controlled by the digital output of the Loop Filter); and (d) Voltage Division block that is capable of supplying each of the ADC Stages with the respective appropriate reference voltage (it should be noted that the Voltage Division block shown in the Figure is implemented as a Resistor Ladder that is composed of multiple identical resistors coupled to the ADC stages. This particular implementation is applicable when it is desired to have Uniform Quantization as shown in FIG. 3. In applications whereby it is desired to have an Adaptive Non-Uniform Quantization as shown in FIG. 5, the Resistor Ladder would be replaced by an Amplifier Ladder consisting of a cascade of multiple programmable gain Amplifier stages whose individual gain will be adjusted by the digital output of the Loop Filter. This is shown in FIG. 4-b. The advantage of the Adaptive Non-Uniform Quantization implementation is that it allows the ADC resolution per bit to vary from the least to the most significant bit based on a desired profile; e.g. logarithmic. Such an architecture will be useful in the digital representation of analog signals with large Crest Factor, such as OFDM signals used in broadband wired and wireless communications). In such a system, one or more settings of the $V_{REF}$ control may set the gains to provide a uniform quantization also. In that regard, selection of uniform versus non-uniform quantization may be, by way example, by an output of the Receiver Mode Control, with the $V_{REF}$ Control controlling the quantization of each bit proportionally, whether the bits are equal or unequal.

Referring now to FIG. 4-a or 4-b, the Supply Voltage ($V_{CC}$) to the multiple stages of the ADC is controlled by a signal generated by the Receiver Mode Control block. When the receiver is in the search state, the receiver Mode Control block will generate an ADC Resolution Control Signal that will cause the ADC Resolution Control block to command the $V_{CC}$ Switch Ladder to provide supply voltage only to No least significant bit stages of the ADC (in most applications $N_0=1$ can be used). Simultaneously, the Receiver Mode Control block will adjust the Threshold Signal value provided to the Compare( ) block such that the presence of a signal above the additive noise floor will be detected. In addition, this Threshold Signal is provided to the ADC Dynamic Range Control Loop in order to enable the loop to adjust the value of $V_{REF}$ to a level that will cause the No least significant bits of the ADC to toggle when the received analog signal is above the noise floor, as detected from the output of the ADC.

In typical communication systems physical layer standards, there are usually a pre-determined number of known Sync Preamble segments for detection at the Receiver side. When the Sync Preamble is present, the Compare( ) block will detect its presence above the noise floor and will provide an output indication to the Receiver Mode Control block, which in response will transition its state to the Sync state.

At the start of the Sync state, the Receiver Mode Control block will generate a new ADC Resolution Control Signal which will cause the Resolution Control block to command the $V_{CC}$ Switch Ladder to provide supply voltage to $N_1$ significant bit stages of the ADC (for WLAN applications, it was determined that $N_1=3$ may be adequate for accurate processing of the Synchronization Preamble).

At the start of the Sync state, the Receiver Mode Control block will adjust the Threshold Signal value provided to the Compare( ) block such that the power of the Sync Preamble signal plus the additive noise, which is computed by the Power( ) block, will remain at a value that will not exceed the Detection Threshold value. In addition, this Threshold Signal is also provided to the ADC Dynamic Range Control Loop in order to enable the loop to adapt the value of $V_{REF}$ to a level such that the received analog signal occupies a significant portion of the full dynamic range of the ADC, which is given by $V_{REF}$. In addition, during the Sync state the parameters of the Loop Filter block will also be adjusted such that the overall ADC Dynamic Range Control Loop will converge after processing the a priori known number of Sync Preamble segments.

With the number of bits expanded to $N_1$ bits, the ADC will supply the Synchronization (Sync) block with an $N_1$ bit digital representation of the Sync Preamble signal. The Sync block will process the Sync Preamble digital signal to estimate various Sync Parameters (such as estimates of the frequency and timing errors and channel amplitude and phase response). The Receiver Mode Control block will determine the number of Sync Preamble segments received after the initial signal presence is detected by the Compare( ) block, and will accordingly transition its state from the Sync state to the subsequent state. After completion of the Sync Preamble processing, the Sync block will begin to modify the input digital signal received after the Sync Preamble to incorporate the estimated values of these parameters and will supply the corrected received digital signal to the Demodulation (Demod) block.

In typical communication systems physical layer standards, there is usually a pre-determined length Control Preamble that follows the Sync Preamble. The modulation characteristics of the Control Preamble are known a priori at the Receiver side. The Control Preamble typically incorporates a Control Message that will specify the modulation parameters of the Data that will follow the Control Preamble. After the conclusion of the Sync state, the Receiver Mode Control block will transition to the Receive Control state.

At the start of the Receive Control state, the Receiver Mode Control block will generate a new ADC Resolution Control Signal which will cause the Resolution Control block to command the $V_{CC}$ Switch Ladder to provide supply voltage to $N_2$ significant bit stages of the ADC (in most communication systems applications, a robust modulation waveform, such as BPSK is used, and for such modulation waveform, it was determined that $N_2=6$ may be adequate for representing a BPSK modulated signal).

Simultaneously at the start of the Receive Control state, the Receiver Mode Control block will adjust the Threshold Signal value provided to the Compare( ) block such that the Power of the Control Preamble signal plus the additive noise, computed by the Power( ) block, will remain at a value that will not exceed the Detection Threshold value. In addition, this Threshold Signal is also provided to the ADC Dynamic Range Control Loop in order to enable the loop to adapt the value of $V_{REF}$ to a level such that the received analog signal occupies a significant portion of the full dynamic range of the ADC, which is given by $V_{REF}$.

With the number of bits expanded to $N_2$ bits, the ADC will supply the Sync block with an $N_2$ bits digital representation of the Sync Preamble analog signal. The Sync block will process the Control Preamble digital signal in order to modify the input digital signal to incorporate the estimated values of the frequency and timing errors and channel amplitude and phase response, and will supply the corrected received digital signal to the Demodulation (Demod) block. During the Receive Control state, the output of the Demod block is provided to the Receiver Mode Control block. This output contains the demodulated Control Preamble message, which the Receiver Mode Control block will process to extract the modulation characteristics of the data signal that follows the Control Preamble. After the Control Preamble is fully received, the Receiver Mode Control block will transition its state to the Receive Data state.

At the start of the Receive Data state and based on the modulation type specified in the Control Preamble message, the Receiver Mode Control block will generate a new ADC Resolution Control Signal which will cause the Resolution Control block to command the $V_{CC}$ Switch Ladder to provide supply voltage to $N_3$ significant bit stages of the ADC (it was determined that $N_3$=6, 8 or 10 may be adequate for representing BPSK, QPSK or QAM modulated signals, respectively).

Simultaneously at the start of the Receive Data state, the Receiver Mode Control block will adjust the Threshold Signal value provided to the Compare( ) block such that the Power of the received signal plus the additive noise, computed by the Power( ) block, will remain at a value that will not exceed the Detection Threshold value. In addition, this Threshold Signal is also provided to the ADC Dynamic Range Control Loop in order to enable the loop to adapt the value of $V_{REF}$ to a level such that the received analog signal occupies a significant portion of the full dynamic range of the ADC, which is given by $V_{REF}$.

With the number of bits expanded to $N_3$ bits, the ADC will supply the Sync block with an $N_3$ bits digital representation of the received analog signal. The Sync block will process the digital signal in order to modify the input digital signal to incorporate the estimated values of the frequency and timing errors and channel amplitude and phase response, and will supply the corrected received digital signal to the Demodulation (Demod) block. During the Receive Data state, the output of the Demod block is provided to the Baseband subsystem (not shown in FIGS. 4-a and 4-b) for further processing. At the end of the transmission (end of the Receive Data state), the system will return to the Search state.

As stated before, one advantage of the present invention is that it greatly simplifies the Automatic Gain Control (AGC) function typically incorporated in most digital receivers. This simplification is mostly caused by the fact that the novel ADC Dynamic Range Control loop replaces the functionality of the AGC loop incorporated in a conventional Digital Receiver Architecture shown in FIG. 1. In addition, the ADC Dynamic Range Control also greatly simplifies the AGC interface with the Radio subsystem, which is a significant feature when the Radio subsystem is located remotely from the digital receiver subsystem. It is also worth mentioning that the present ADC Dynamic Range Control invention will also help in reducing the cost of the Radio subsystem. Furthermore, with the ADC Dynamic Range Control invention, an Adaptive Non-Uniform Quantization can be realized, which is a feature that is not found in any prior art in this area.

The power consumption of the ADC is managed by changing the number of ADC Resolution Bits N. The number of ADC Resolution Bits N is adapted based on the Receiver state, thus allowing the power consumption to be reduced by adapting the number of ADC Resolution Bits N as needed for each of the Receiver states. For example, during the search state, N=1 may be used, causing significant power consumption reduction in that state. Furthermore, the number of ADC Resolution Bits N is also adapted to be commensurate with the received signal modulation, thus allowing the power consumption to be proportional to the modulation being processed by the digital receiver.

Using an Amplifier Ladder wherein the individual gain of each amplifier can be adjusted by the digital output of the Loop Filter, instead of the Resistor Ladder supplying $V_{REF}$ to the ADC stages, allows the implementation of an adaptive uniform or non-uniform quantization. (The uniform quantization implemented using the Resistor Ladder is a special case of the implementation using the Amplifier Ladder with equal gains for each of the elements of the Amplifier Ladder). The advantage of using the Adaptive Non-Uniform Bit Resolution implementation is it allow the resolution per bit to vary from the least to the most significant bit based on a desired profile; e.g. logarithmic. Such an approach will be useful in the digital representation of analog signals with large Crest Factor, such as OFDM signal used in broadband wired and wireless communications).

In the foregoing embodiments, the ADC clock rate (sampling frequency) was assumed to be fixed. However that is not a limitation of the invention. The ADC clock rate might be changed dependent upon the data rate. For example, for a given modulation, if the data rate is lowered, then the clock rate can also be lowered. Because changing the clock rate to any arbitrary value requires the addition of a Phase Lock Loop (PLL), in most digital receivers designs the clock rate is left at a constant rate and Sample Rate Reduction is done in the digital domain by processing the output of the ADC. However, since a lower clock rate will also result in reduction in the ADC power consumption, the Receiver Mode Control block may also be capable of generating an ADC Clock Rate control signal that will adjust the ADC clock rate based on the control information extracted from the Control Preamble.

It should be further noted that functional components, as shown in the figures and described above in the text accompanying the figures, could be implemented using software code segments. If the aforementioned functional components are implemented using software code segments, these code segments can be stored on a machine-readable medium, such as ROM, floppy disk, hard drive, CD-ROM, DVD, tape, memory, or any storage device that is accessible by a computing machine.

While certain exemplary embodiments have been described and shown in accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A digital receiver comprising:
an analog to digital converter coupled to receive an analog signal and convert the analog signal to a digital signal, the converter having an analog to digital conversion ratio dependent on a reference voltage provided thereto;

a power sensor coupled to the output of the analog to digital converter to provide a power sensor output responsive to the digital signal;

a loop filter coupled to the power sensor and smoothing the output of the power sensor to provide a loop filter output;

a reference voltage control responsive to the output of the loop filter to provide the reference voltage to the analog to digital converter;

a demodulator coupled to the output of the analog to digital converter; and, a receiver mode control coupled to the output of the demodulator, an output of the receiver mode control providing a threshold signal output responsive to a mode of receiver operation sensed by the receiver mode control, the loop filter being responsive to the difference in the output of the power sensor and the threshold signal output.

2. The digital receiver of claim 1 wherein the reference voltage control is comprised of a programmable gain amplifier responsive to the output of the loop filter to provide a reference voltage output to a resistor ladder associated with the analog to digital converter.

3. The digital receiver of claim 1 wherein the reference voltage control is comprised of a plurality of programmable gain amplifiers responsive to the output of the loop filter to provide individually programmable reference voltages to a plurality of stages in the analog to digital converter.

4. The digital receiver of claim 1 further comprised of a demodulator coupled to the output of the analog to digital converter.

5. The digital receiver of claim 1 further comprised of a resolution control responsive to an output of the receiver mode control to control the number of stages of the analog to digital converter that are active.

6. The digital receiver of claim 1 wherein the analog to digital converter has a sample rate responsive to a data rate in a received signal.

7. The digital receiver of claim 1 wherein the analog to digital converter has uniform quantization.

8. The digital receiver of claim 1 wherein the analog to digital converter has non-uniform quantization.

9. The digital receiver of claim 1 wherein the analog to digital converter is controllable between uniform and non-uniform quantization.

* * * * *